United States Patent
van Saders et al.

(10) Patent No.: US 6,853,526 B1
(45) Date of Patent: Feb. 8, 2005

(54) TRANSIENT OVERVOLTAGE PROTECTION CIRCUIT

(75) Inventors: John van Saders, Asbury, NJ (US); Douglas M. Johnson, Lansdale, PA (US)

(73) Assignee: Anadigics, Inc., Warren, NJ (US)

( * ) Notice: Subject to any disclaimer, the term of this patent is extended or adjusted under 35 U.S.C. 154(b) by 471 days.

(21) Appl. No.: 09/668,181

(22) Filed: Sep. 22, 2000

(51) Int. Cl.$^7$ ................................................ H02H 3/22
(52) U.S. Cl. ...................................... 361/91.1; 361/111
(58) Field of Search .............................. 361/55, 56, 57, 361/58, 91.1, 111, 112, 117, 118, 119, 18; 333/4, 5, 25

(56) References Cited

U.S. PATENT DOCUMENTS

| | | | |
|---|---|---|---|
| 3,993,880 A | * 11/1976 | O'Neill | 379/377 |
| 4,705,967 A | * 11/1987 | Vasile | 327/581 |
| 4,758,920 A | 7/1988 | McCartney | 210/801 |
| 4,893,158 A | 1/1990 | Mihara et al. | 357/23.13 |
| 4,899,382 A | * 2/1990 | Gartner | 379/413 |
| 4,907,120 A | 3/1990 | Kaczmarek et al. | 361/119 |
| 4,930,036 A | 5/1990 | Sitch | 361/56 |
| 4,947,062 A | * 8/1990 | Weiner et al. | 327/105 |
| 5,136,455 A | * 8/1992 | Billingsley | 361/56 |
| 5,159,518 A | 10/1992 | Roy | 361/56 |
| 5,229,635 A | 7/1993 | Bessolo | 257/360 |
| 5,301,081 A | * 4/1994 | Podell et al. | 361/56 |
| 5,313,086 A | 5/1994 | Jinbo | 257/355 |
| 5,333,105 A | * 7/1994 | Fortune | 363/56.11 |
| 5,543,649 A | 8/1996 | Kim et al. | 257/355 |
| 5,565,692 A | 10/1996 | Michon | 257/77 |
| 5,637,901 A | 6/1997 | Beigel et al. | 257/355 |
| 5,697,092 A | * 12/1997 | Mourant et al. | 455/323 |
| 5,818,086 A | 10/1998 | Lin et al. | 257/355 |
| 5,841,172 A | 11/1998 | Morishita et al. | 257/355 |
| 5,963,409 A | 10/1999 | Chang | 361/56 |
| 5,991,134 A | 11/1999 | Tan et al. | 361/56 |
| 5,994,741 A | 11/1999 | Koizumi et al. | 257/355 |
| 6,046,476 A | 4/2000 | Morishita et al. | 257/347 |
| 6,057,873 A | * 5/2000 | Adams, III | 725/149 |
| 6,064,093 A | 5/2000 | Ohta | 257/355 |
| 6,072,219 A | 6/2000 | Ker et al. | 257/355 |
| 6,522,151 B2 | * 2/2003 | Armistead et al. | 324/538 |

* cited by examiner

*Primary Examiner*—Brian Sircus
*Assistant Examiner*—Danny Nguyen
(74) *Attorney, Agent, or Firm*—Morgan Lewis

(57) ABSTRACT

A circuit and method are disclosed for protecting an integrated circuit (IC) against transient overvoltages. The circuit comprises a balun transformer and a normally-off transistor. The balun input terminals are connected to an unbalanced circuit, while the balun output terminals are connected to a balanced circuit. The transistor is connected between the balun output terminals and has a gate connected to ground or to some other reference voltage. When an overvoltage transient signal reaches the balun input terminals, the balun transformer converts the transient to a balanced transient signal on the two branches of the balanced circuit. During overvoltage conditions, one balun output terminal will have a voltage which swings low enough that the protection transistor turns on, effectively shorting the overvoltage spike and protecting any upstream (or downstream) IC components from damage. When the transient is over, the transistor returns to the "off" state.

8 Claims, 2 Drawing Sheets

US 6,853,526 B1

TRANSIENT OVERVOLTAGE PROTECTION CIRCUIT

FIELD OF THE INVENTION

The present invention relates generally to devices for protecting the input or output terminals of integrated circuits from excessive voltages. More particularly, the invention relates to a transient overvoltage protection circuit that converts an incoming transient overvoltage signal to a balanced (differential) transient signal and then shorts the balanced signal to itself via a transistor, thereby dissipating the transient signal.

BACKGROUND OF THE INVENTION

In RF communications systems, such as telephone or cable-television systems (CATV), signal transmission conductors are frequently exposed to transient overvoltages. These transients may be caused, for example, by lightning, the switching of nearby power cables, or field operations such as "hot-coring," in which live transmission cables are cut for connector attachment, in turn generating transients of up to 150 V. If these transients are not prevented from reaching sensitive components in the communication system, such as semiconductor line amplifiers, the components may be severely damaged.

Circuits for limiting the electrical energy reaching a device through a conductor have existed for many years. Protection circuits may include silicon diodes, PIN diodes, Schottky diodes, shunt bipolar transistors, insulated gate field effect transistors (IGFETs), metal oxide field effect transistors (MOSFETs), and metal-semiconductor field effect transistors (MESFETs).

FIG. 1A shows, for example, a conventional MOSFET-based circuit described in U.S. Pat. No. 5,543,649 to Kim et al. In this circuit, the gate 1 and the P+drain 2 of a P-channel dielectric gate MOSFET are coupled to an input voltage Vx, and the P+ source 3 of the MOSFET is coupled to a substrate voltage Vss. As can be seen from FIG. 1B, a PNP-type parasitic transistor composed of the P+ source and drain regions 2 and 3 and the N-type substrate 4 is also formed. The potential of the substrate voltage Vss is placed between a negative voltage and zero volts, and the N-type substrate 4 is coupled to the substrate voltage Vss or to some other reference voltage. This protection device utilizes a junction breakdown which occurs between the P+ drain and the N-type substrate when the protected input (drain) voltage is 0.7 V greater than the source voltage.

However, a MOSFET-based circuit such as the one shown in FIG. 1A is unsuitable for application to line amplifiers included on a gallium arsenide (GaAs) monolithic microwave integrated circuit (MMIC). First, it requires the use of both N- and P-channel devices. Second, it is designed for use on an unbalanced signal line. Since line amplifiers are frequently applied in a balanced-signal configuration in combination with an off-chip balun transformer, two circuits of the type shown in FIG. 1A would have to be used to protect the two phase legs of the balanced signal—or, alternatively, an off-chip MOSFET device would have to be connected after the balun transformer—thus adding to the cost of the protected circuit. Third, although overvoltage transients are frequently dampened sinusoids having both positive and negative voltage swings, the circuit of FIG. 1A cannot clamp the negative portions of an overvoltage transient except by breakdown of the MOSFET. Fourth, it can only be used where the input voltages are small, because the parasitic PNP transistor turns on whenever the source voltage is 0.7 V less than the input (drain) voltage. Finally, it adds a large amount of harmonic and intermodulation distortion to an upstream line amplifier. In order to prevent the protection circuit from adding to harmonic or intermodulation distortion in highly linear amplifiers, protection transistors must be deeply biased below threshold to ensure that very high impedances are presented.

OBJECT OF THE INVENTION

It is accordingly an object of the invention to provide a transient overvoltage protection circuit capable of integration on a GaAs MMIC and capable of clamping both positive and negative power surges on an RF communication line. A further object of the invention is to provide a transient overvoltage protection circuit which does not transfer the transient signal onto either a positive or negative voltage supply line. A still further object of the invention is to avoid adding harmonic or intermodulation distortion to the line amplifier signals.

SUMMARY OF THE INVENTION

These features are provided in accordance with the present invention. A transient overvoltage protection circuit is disclosed which comprises a balun transformer and a normally-off protection transistor. The balun transformer has a pair of input terminals and a pair of output terminals. The balun input terminals are connected to an unbalanced circuit (a circuit whose two sides are electrically unequal with respect to a common reference point, usually ground, and one of whose two sides is normally substantially at ground potential). The balun output terminals are connected to a balanced circuit (a circuit whose two sides are electrically alike and symmetrical with respect to a common reference point, usually ground). The transistor has one output terminal connected to one of the balun output terminals, a second output terminal connected to the other balun output terminal, and a control terminal connected to ground or to some other reference voltage. In the preferred embodiment of the invention, the transistor is a depletion-mode MESFET, although other types of transistors may be used.

When an unbalanced overvoltage transient signal—which may be defined as a transient signal on a circuit whose two sides are electrically unequal with respect to a reference voltage—is present at the balun input terminals, the balun transformer converts the unbalanced transient signal to a balanced transient signal which is output from the balun transformer at a pair of output terminals. More specifically, the balanced transient signal is a difference signal formed by two opposing signals which are 180 degrees out-of-phase which appear at the two balun output terminals. During overvoltage conditions, one balun output will have a voltage which swings low enough that the protection transistor turns "on," i.e., it conducts current between its source and drain. Here, the "source" is the transistor output terminal with transient voltages below the control terminal bias voltage, while the "drain" is the transistor output terminal with transient voltages above the control terminal voltage. The current through the protection transistor lowers the drain voltage while raising the source voltage, thus effectively shorting the overvoltage spike and protecting any downstream IC components from damage. When the transient is over, the transistor returns to the "off" state.

The invention is also directed to a method for protecting a circuit against overvoltage transients. The method comprises the following steps: (1) converting the unbalanced overvoltage transient signal to a balanced transient signal; and (2) coupling the balanced transient signal to the output terminals of a transistor having its control terminal coupled to a reference voltage.

DETAILED DESCRIPTION OF THE INVENTION

Figure 1A:
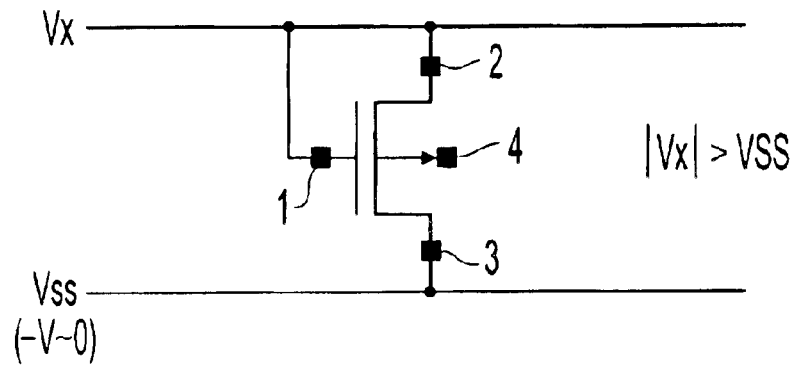
FIG. 1A is a schematic circuit diagram of a conventional MOSFET-based transient overvoltage protection circuit.
Figure 1B:
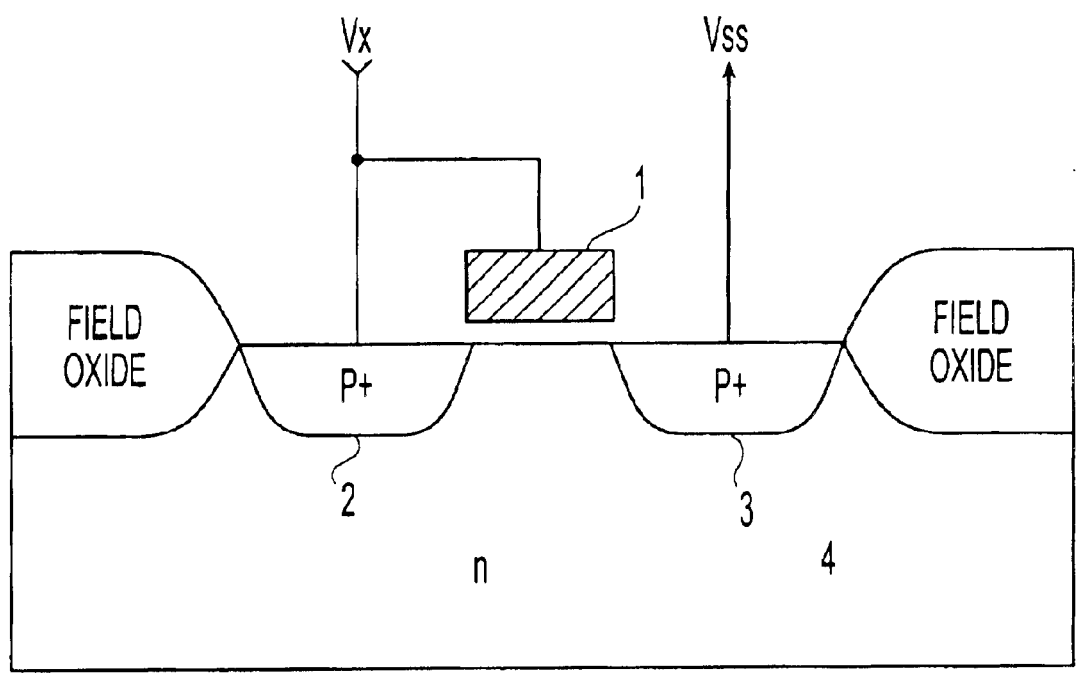
FIG. 1B is a structural diagram of the circuit shown in FIG. 1A.
Figure 2:
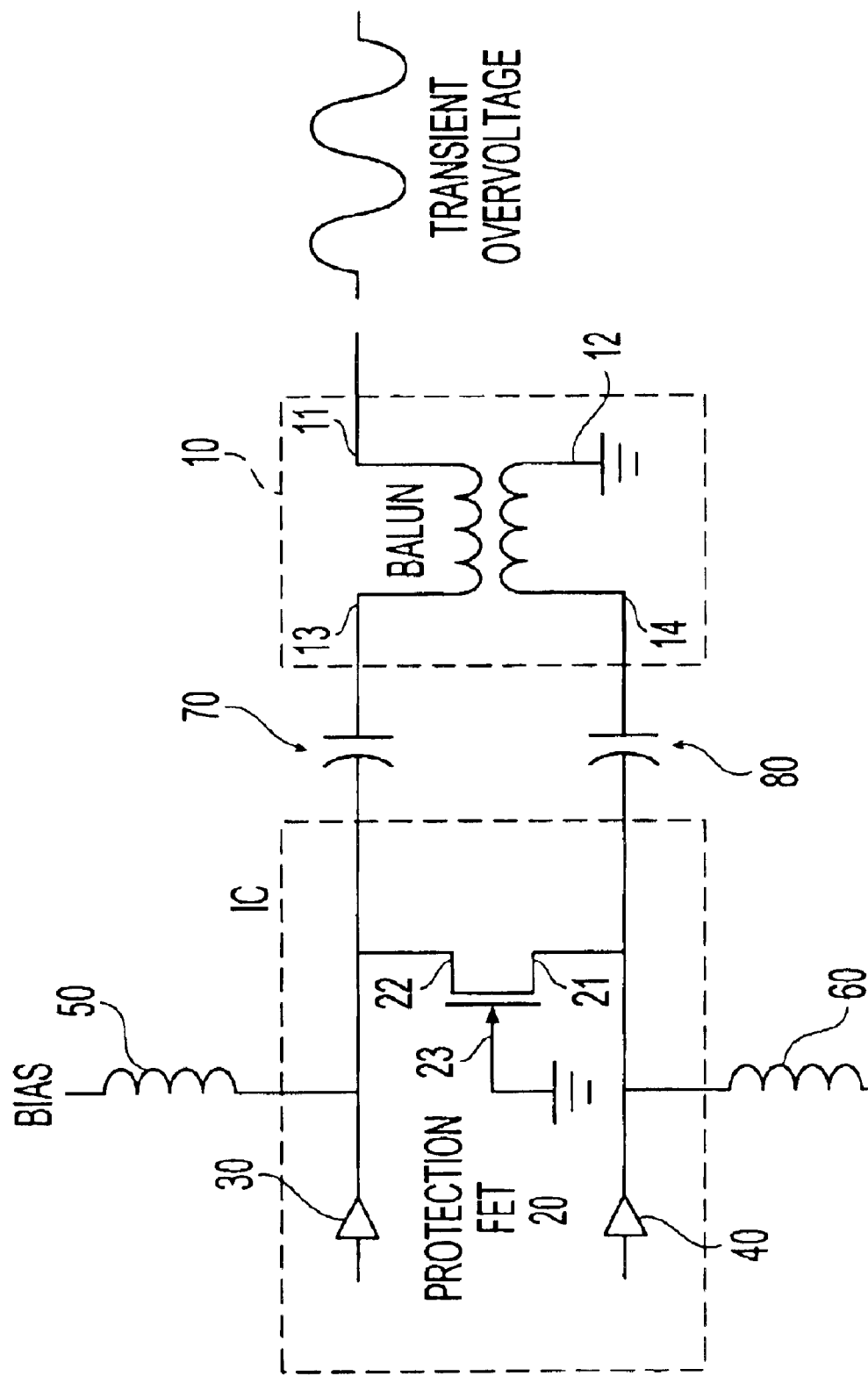
FIG. 2 is a schematic circuit diagram of an embodiment of the transient overvoltage protection circuit of the present invention

A preferred embodiment of the transient overvoltage protection circuit of the present invention is illustrated in FIG. 2. The circuit comprises a balun transformer 10 and a normally-off transistor 20. The balun transformer has a pair of input terminals 11 and 12 on which an unbalanced transient overvoltage signal appears and a pair of output terminals 13 and 14. The protection transistor 20 has a source terminal 21 connected to one of the balun output terminals 14, a drain terminal 22 connected to the other balun output terminal 13, and a gate terminal 23 connected to ground or to some other reference voltage. Downstream components (if an input is being protected)—or upstream components (if an output is being protected)—may include RF amplifiers 30 and 40, which are shown in FIG. 2 connected to the two balun output terminals 13 and 14. Optional bias inductors 50 and 60 provide a DC bias voltage (for example, +12 V) to the balun output terminals 13 and 14, which, when present, is blocked from the balun transformer output terminals 13 and 14 by two optional DC blocking capacitors 70 and 80.

Under normal operating conditions, gate 23 of protection transistor 20 is biased to a voltage which is less than the threshold voltage of the protection transistor 20 relative to the source voltage. In a preferred embodiment, protection transistor 20 is a MESFET having a threshold voltage (gate-to-source) of about –1 V. When, as shown in FIG. 2, gate 23 is connected to ground (0 V), and source and drain terminals 13 and 14 are biased to 12V by inductors 50 and 60, the protection transistor gate-to-source voltage is about –12 V. (The gate-to-source voltage is the voltage at gate 23, 0 V, minus the voltage at source 21, +12 V, or 0 V 12 V=–12 V). Protection transistor 20 is therefore held in a non-conducting state (Vgs<Vt) under normal conditions. Furthermore, when protection transistor 20 is deeply biased below the threshold (i.e., in an "off" state), it presents a very high impedance which has little contribution to harmonic and intermodulation distortion in the line amplifier.

When an overvoltage transient signal is present at the balun input terminals 11 and 12, however, balun transformer 10 converts the unbalanced transient signal to a balanced transient signal which is output from balun transformer 10 at output terminals 13 and 14. Specifically, the balanced transient signal is a difference signal formed by two opposing signals appearing at balun output terminals 13 and 14 which are 180 degrees out-of-phase. The opposing signals oscillate around the DC bias voltage (for example, 12 V). During overvoltage conditions, one balun output, for example 14, will have a negatively-going transient signal while the other, for example 13, will have a positively-going transient signal. Because a typical transient signal may be at a frequency of around 80 MHZ, the transient signals readily propagate across the DC blocking capacitors 70 and 80.

Under these circumstances, the voltage associated with the balun output terminal which has the negatively-going transient signal (here, 14) drops below 12 V, and eventually swings below the threshold voltage of protection transistor 20. Where the inductor bias voltage is 12 V and the protection transistor gate voltage is 0 V, the threshold voltage is met when the voltage at balun output terminal 14 reaches about 1 V, such that the voltage at gate 23 minus the 1 voltage at source 21 (Vgs) is about –1 V. Protection transistor 20 then ceases to be fully depleted and begins to turn "on," i.e., it begins to conduct current between balun output terminals 13 and 14. As the voltage at balun output terminal 14 swings still lower and the gate-to-source voltage becomes less negative, protection transistor 20 fully turns on. This effectively shorts the overvoltage spike, protecting any upstream or downstream IC components from damage. The circuit thus uses the differential nature of the balanced transient signal and the fast switching characteristics of field effect transistors to protect the downstream (or upstream) components from overvoltage spikes. Should the protection transistor 20 be unable to shunt the entire transient, the voltage at the balun output terminal 14 will continue to decrease. When it is less than –0.75 V (relative to the gate voltage), however, the metalsemiconductor junction (or Schottky diode) formed by gate 23 and source 21 of the MESFET of the preferred embodiment becomes forward-biased, and an avalanche current flows from the gate 23 to the source 21. The source voltage is therefore clamped at –0.75 V (the gate voltage minus the forward-biased Schottky diode voltage). When the transient is dissipated, the protection transistor 20 returns to the "off" state.

Various additional aspects of the preferred embodiment will now be described. First, in a preferred embodiment of the invention, protection transistor 20 is a depletion-mode MESFET, and, accordingly, the above description refers to the "source", "drain", and "gate" of protection transistor 20, by which terms the terminals of a MESFET are commonly identified. However, those of skill in the art will recognize that the invention described above also may be implemented with other types of transistors, including IGFETS, JFETS, HFETS, BJTs and HBTs, so long as the following conditions are met: (1) the transistor is bidirectional, or capable of conducting current in either direction through the transistor output terminals, depending on the applied output terminal voltages; and (2) the transistor may be placed in an "off" state by a reference voltage applied to its control terminal. As those of skill in the art will appreciate, various control terminal and transistor output terminal voltages may be used, depending on the type of transistor and the application of the protection circuit.

Second, although a typical MESFET has a gate-drain spacing ($L_{GD}$) of about 1 micron, the gate-drain spacing (and gate-source spacing) in the preferred embodiment is 3–4 microns, so that the protection transistor breakdown voltage is increased. Third, a current-limiting resistor may be inserted between gate 23 and ground to reduce the amount of current flowing, for example, from gate 23 to source 21 if the metal-semiconductor gate-source junction becomes forward biased. Fourth, in a preferred embodiment, RF amplifiers 50 and 60 also are designed to be fairly rugged, so that their breakdown voltage is not exceeded by the rising edge of an incoming transient.

While the invention has been described with reference to a preferred embodiment, it will be appreciated by those of ordinary skill in the art that modifications also may be made to the structure and form of the invention without departing from its spirit and scope, which is defined in the following claims.

What is claimed is:

1. A transient overvoltage protection circuit, comprising:
   a. a normally-off bidirectional transistor having a first output terminal coupled to a first signal branch of a balanced circuit, a second output terminal coupled to a second signal branch of the balanced circuit, and a control terminal connected to a reference voltage;
   wherein a balanced overvoltage transient signal present on the first and second signal branches of the balanced circuit causes said bidirectional transistor to become conductive and to shunt the balanced transient from said first output terminal to said second output terminal.

2. The transient overvoltage protection circuit of claim 1, further comprising:
   a. a balun transformer, having a pair of input terminals capable of receiving an unbalanced transient signal and a pair of output terminals connected to the first and second signal branches of the balanced circuit, wherein said balun transformer converts an unbalanced overvoltage transient signal appearing at its input terminals to a balanced overvoltage transient signal appearing at its output terminals.

3. The circuit according to claim 1 or 2 wherein said bidirectional transistor is one of a MESFET, MOSFET, JFET, or HFET.

4. The circuit according to claim 1 or 2 wherein said bidirectional transistor is one of a BJT or an HBT.

5. The circuit according to claims 1 or 2, additionally comprising:
   a. a resistor inserted between said control terminal and said reference voltage.

6. The circuit according to claims 1 or 2, additionally comprising:
   a. a first bias impedance coupled between said first output terminal of said bidirectional transistor and a first bias voltage source; and
   b. a second bias impedance coupled between said second output terminal of said bidirectional transistor and a second bias voltage source;
   c. a first capacitor coupled between said first output terminal of said bidirectional transistor and one of the pair of said balun output terminals; and
   d. a second capacitor coupled between said second output terminal of said bidirectional transistor and the other of the pair of said balun output terminals.

7. A method for protecting a circuit against overvoltage transients, comprising the step of:
   a. coupling a balanced transient signal to a first output terminal and a second output terminal of a bidirectional transistor which has a control terminal coupled to a reference voltage;

wherein said balanced transient signal causes said bidirectional transistor to become conductive and to shunt said balanced overvoltage transient signal from said first output terminal to said output terminal of said bidirectional transistor.

8. The method of claim 7, further comprising the step of first converting an unbalanced overvoltage transient signal to a balanced transient signal.

\* \* \* \* \*

UNITED STATES PATENT AND TRADEMARK OFFICE
CERTIFICATE OF CORRECTION

PATENT NO. : 6,853,526 B1
DATED : February 8, 2005
INVENTOR(S) : van Saders et al.

It is certified that error appears in the above-identified patent and that said Letters Patent is hereby corrected as shown below:

Column 6,
Line 20, replace "said output terminal" with -- said second output terminal --.

Signed and Sealed this

Seventeenth Day of May, 2005

JON W. DUDAS
*Director of the United States Patent and Trademark Office*